(12) United States Patent
Schnell et al.

(10) Patent No.: US 6,629,368 B2
(45) Date of Patent: Oct. 7, 2003

(54) METHOD FOR ISOTHERMAL BRAZING OF SINGLE CRYSTAL COMPONENTS

(75) Inventors: Alexander Schnell, Ennetbaden (CH); John Fernihough, Ennetbaden (CH); Maxim Konter, Klingnau (CH)

(73) Assignee: Alstom (Switzerland) Ltd., Baden (CH)

( * ) Notice: Subject to any disclaimer, the term of this patent is extended or adjusted under 35 U.S.C. 154(b) by 0 days.

(21) Appl. No.: 10/140,062

(22) Filed: May 8, 2002

(65) Prior Publication Data

US 2003/0066177 A1 Apr. 10, 2003

(30) Foreign Application Priority Data

May 14, 2001 (EP) .......................................... 01111652

(51) Int. Cl.[7] ................................................ B23P 15/00
(52) U.S. Cl. ............... 29/889.1; 29/402.07; 29/402.18; 29/402.13; 228/119
(58) Field of Search ............. 29/889.1, 402.04, 29/402.05, 402.06, 402.07, 402.18, 402.16, 402.13; 228/119; 148/562, 528, 675, 27; 420/448, 441, 442, 445, 446, 447; 416/241 R

(56) References Cited

U.S. PATENT DOCUMENTS

| | | |
|---|---|---|
| 3,155,491 A | 11/1964 | Hoppin et al. |
| 4,188,237 A | 2/1980 | Chasteen |
| 4,381,944 A | 5/1983 | Smith, Jr. et al. |
| 4,643,782 A | 2/1987 | Harris et al. |
| 5,071,486 A | 12/1991 | Chasteen |
| 5,156,321 A | 10/1992 | Liburdi et al. |
| 5,437,737 A | 8/1995 | Draghi et al. |
| 5,584,948 A * | 12/1996 | Huron .......................... 148/556 |
| 5,666,643 A | 9/1997 | Chesnes et al. |
| 5,728,227 A | 3/1998 | Reverman |
| 5,732,467 A | 3/1998 | White et al. |

(List continued on next page.)

FOREIGN PATENT DOCUMENTS

| | | |
|---|---|---|
| EP | 0034041 B1 | 8/1981 |
| EP | 0815993 A1 | 1/1998 |
| JP | 2001269784 A | * 10/2001 |

OTHER PUBLICATIONS

Nishimoto Kazutoshi et al, "Single–crystallization behavior in TLP–bonded interlayer–transient liquid phase bonding of Ni–base single crystal superalloy (Report 6)", Yosetsu Gakkai Ronbunshi; Yosetsu Gakkai Ronbunshu/Quarterly Journal Of The Japan Welding Society Nov. 1998 Japan Welding Soc, Tokyo, Japan, vol. 16, No. 4, Nov. 1998, pp. 530–539, XP001018286 *abstract; table 1*.

Warren M. Miglietti et al, "Microstructure, Mechanical Properties and Coatability of Diffusion Brazed CMSX–4 Single Crystal", Proceedings of the 1996 Inernational Gas Turbine and Aeroengine Congress & Exhibition; Burmingham, UK Jun. 10–13, 1996, XP001018287, Am. Soc. Mech. Eng. Pap; American Society of Mechanical Engineers (Paper) 1996 ASME, New York, NY, USA *the whole document*.

Primary Examiner—I Cuda Rosenbaum
(74) Attorney, Agent, or Firm—Adam J. Cermak

(57) ABSTRACT

A process of brazing cracks and gaps in a single crystal article which takes places isothermally under the following conditions: the temperature of the isothermal solidification is between $T_{Liqidus,\ Braze}+5*(wt-\%B_{Braze})$ and $(T_{solidus,\ base\ material}-70*(wt-\%B_{Braze}))$, while $(wt-\%B*wt-\%Cr)$ is between 15 and 40 and $(T_{solv.\gamma',\ base\ material}-T_{Liqidus,\ Braze})$ is above 140° C. This results in an homogeneous $\gamma/\gamma'$-microstructure of the isothermal solidified, brazed joint with mechanical properties similar to those of the base material.

15 Claims, 3 Drawing Sheets

U.S. PATENT DOCUMENTS 5,759,301 A    6/1998  Konter et al.
5,822,852 A   10/1998  Bewlay et al.
5,882,446 A *  3/1999  Konter ....................... 148/562
5,888,451 A    3/1999  Konter et al.
6,193,141 B1 * 2/2001  Burke et al. ................ 228/190
6,277,500 B1 * 8/2001  Konter et al. ............... 428/615
6,280,857 B1 * 8/2001  Sommer et al. ............. 428/633
6,383,312 B1 * 5/2002  Konter et al. ................ 148/410
6,419,763 B1 * 7/2002  Konter et al. ................ 148/404
6,503,349 B2 * 1/2003  Pietruska et al. ........... 148/562
6,508,000 B2 * 1/2003  Burke et al. ................ 29/889.1
2002/0185198 A1 * 12/2002 Pietruska et al. ........... 148/528

\* cited by examiner

METHOD FOR ISOTHERMAL BRAZING OF SINGLE CRYSTAL COMPONENTS

TECHNICAL FIELD

The invention relates to a method for isothermal brazing of cracks or gaps in single crystal components according to the preamble of the independent claim.

STATE OF THE ART

The wide use of single crystal (SX) and directionally solidified (DS) components allows an increased turbine inlet temperature and therefore an increased turbine efficiency as well. Alloys, specially designed for SX/DS casting, were developed in order to make maximum use of material strength and temperature capability. During operation of such components under high temperature conditions, various types of damages can occur. For example, cracks can result from thermal cycling and foreign object impact. In addition, cracks and inclusions may be incurred during manufacture. Because the cost of the components formed from high temperature nickel base superalloys is relatively high, it is usually more desirable to repair these components than to replace them.

The following state of the art methods for repairing high temperature superalloys are generally known:

U.S. Pat. No. 5,732,467 discloses a method of repairing cracks on the outermost surface of an article having a directionally oriented microstructure and a superalloy composition. The repairing is done by coating the cleaned crack surface with a material featuring the same material composition as said article. Thereby the coated crack surface is subjected to an elevated temperature and isostatic pressure over a period of time sufficient to repair the crack surface without changing the crystalline microstructure of the parent article.

In addition, a number of alternative methods of brazing for repairing cracks or gaps are known. U.S. Pat. No. 5,666,643 discloses a braze material for repairing an article, in particular components made from a cobalt and a nickel-base superalloy, such as gas turbine engine parts. The braze material is composed of particles featuring a high melting temperature which are distributed within the braze alloy. These particles could be of single crystal, directionally solidified, or equiaxed microstructure. But, even if particles featuring a single crystal structure are used, the structure of the repaired crack as a whole due to the braze alloy differs with respect to material properties from the single-crystal structure of the base material which leads to weakness problems of the brazed joint. This is especially valid for cracks located at stress concentrations.

The same problem occurs with the repair methods disclosed in U.S. Pat. No. 4,381,944 or U.S. Pat. No. 5,437,737 where a braze alloy and a filler material are used at the same time to increase the strength of the brazed joint. Another method of repairing by sintering is disclosed in U.S. Pat. No. 5,156,321.

SUMMARY OF INVENTION

It is object to the present invention to find an advanced process of joining or repairing cracks or gaps in a single crystal article made from a Nickel based superalloy by means of isothermal, epitaxial single crystal solidification of a brazing alloy.

This objective is addressed by a process wherein the Temperature of the isothermal solidification is between $T_{Liquids\ Braze} + 5*(wt\text{-}\%B_{Braze})$ and $(T_{solidus,\ base\ material} - 70*(wt\text{-}\%B_{Braze}))$, while $(wt\text{-}\%B_{Braze}*wt\text{-}\%Cr_{Braze})$ is between 15 and 40 and $(T_{solv.\gamma,\ base\ material} - T_{Liqidus,\ Braze})$ is above 140° C.

These conditions lead to a homogeneous γ/γ'-microstructure with mechanical properties of the brazed joint similar to those of the parent material.

Stringent performance requirements dictate regular overhaul schedules which makes brazing of single crystal components an imperative and economical process.

The single crystal brazing conditions will fully maintain the single crystal structure in the braze-repaired crack resulting in a Young's Modulus as low as that of the base material. This leads to a high Thermal Fatigue (TF) resistance and Thermal Mechanical Fatigue (TMF) resistance as well to a high Low Cycle Fatigue (LCF) value in the braze-repaired areas.

With advantage, the braze material is Ni based and contains (wt-%) 8–15 Cr and (wt-%) 1–3 B.

The heat treatment of the isothermal solidification takes place at a temperature of 1120–1160° C. for 8 to 20 h, preferably at a temperature of 1140° C. For reasons of in-situ adjusting of the microstructure of the brazed joint there can be a heat treatment of 1180° C. for 30 min after the heat treatment. In addition, to allow a good melting of the brazing material there will be, before the heat treatment of 1120–1160° C., a heat treatment of 1180 to 1200° C. for 20 to 30 min followed by a cooling of 1–2° C./min.

After brazing the temperature is lowered at a rate of 1 –2° C./min to a temperature between 800–900° C. and it is held for 1 to 6 hours to precipitate γ'.

The crack or gap will have a maximum width of 300 μm. The braze slurry will be applied into and over the crack or gap and a mixture of brazing alloy and filler material is applied on top of the braze slurry before applying the heat treatment of the brazing. A protective coating can be removed before applying the method and the protective coating is reapplied after applying the method. The surface of the crack or gap can be cleaned from oxides before applying the method. A Flour-Ion-Cleaning-Method can be used for cleaning the surface before applying the process.

SHORT SUMMARY OF DRAWINGS

The invention is illustrated by the accompanying drawings, in which

PREFERRED EMBODIMENT OF THE INVENTION

The invention relates to a method of repairing cracks or gaps in a single crystal article made of a Nickel base superalloy by means of brazing. Nickel base superalloys are known in the state of the art, e.g. from the document U.S. Pat. No. 5,888,451, U.S. Pat No. 5,759,301 or from U.S. Pat No. 4,643,782, which is known as "CMSX-4". The single crystal article could possibly be a part of a gas turbine such as a blade and vane or a part of the burner chamber of the gas turbine. During service the article is subjected to the hot environment of the gas turbine which leads to the deleterious effect of cracks and gaps in the surface of the article.

Before applying the method of brazing as described below, a protective coating such as MCrAlY or thermal barrier coating (TBC), has to be removed by a process of acid stripping, grit blasting or mechanical grinding. At the same time this method also cleans the surface layer of the parent material from unwanted oxides. In addition, the surface of the crack or gap may be cleaned from oxides by a Flour-Ion-Cleaning (FIC) process, which is widely known in state of the art. The FIC process removes the stable $Al_2O_3$ oxides and depletes Al from the surface, thereby improving the braze flow and the repair of the cracked components. The process subjects the oxidized (and sulphidized) components to a highly reducing gaseous atmosphere of hydrogen and hydrogen fluoride at high temperatures, which may vary from 900° C. to 1000° C. Such FIC-processes are disclosed, for example, in EP-B1 -34041, U.S. Pat. Nos. 4,188,237, 5,728,227 or in U.S. Pat. No. 5,071,486. After successful completion of the brazing method according the invention, the component will be re-coated.

In order to braze the crack or gap it is filled with a brazing alloy. The table 1 shows the content of different alloys used for experimental purpose.

TABLE 1

Chemical Composition of braze-alloy (wt.- %)

| Braze | Cr | Co | W | Ta | Fe | Al | B | Si | Ni | $T_{Liquidus}$ |
|---|---|---|---|---|---|---|---|---|---|---|
| No. 1 | 10 | 10 | 4 | 3.0 | — | 3.0 | 2.5 | — | bal. | 1106° C. |
| No. 2 | 14 | 10 | — | 2.5 | — | 3.5 | 2.7 | — | bal. | 1104° C. |
| No. 3 | 15 | 10 | — | 3.5 | — | 3.5 | 2.3 | — | bal. | 1110° C. |
| No. 4 | 15 | 10 | 4.0 | 3.0 | — | 3.0 | 2.0 | — | bal. | 1109° C. |
| No. 5 | 15 | 10 | 4.0 | 3.0 | — | 3.0 | 1.6 | — | bal. | 1110° C. |
| No. 6 | 15 | 10 | 4.0 | 3.5 | — | 4.5 | 2.0 | — | bal. | 1109° C. |
| No. 7 | 15 | 10 | 4.0 | 3.5 | — | 4.5 | 1.6 | — | bal. | 1110° C. |
| No. 8 | 10 | 10 | 4.0 | 2.5 | — | 3.5 | 1.8 | — | bal. | 1110° C. |

Figure 1:
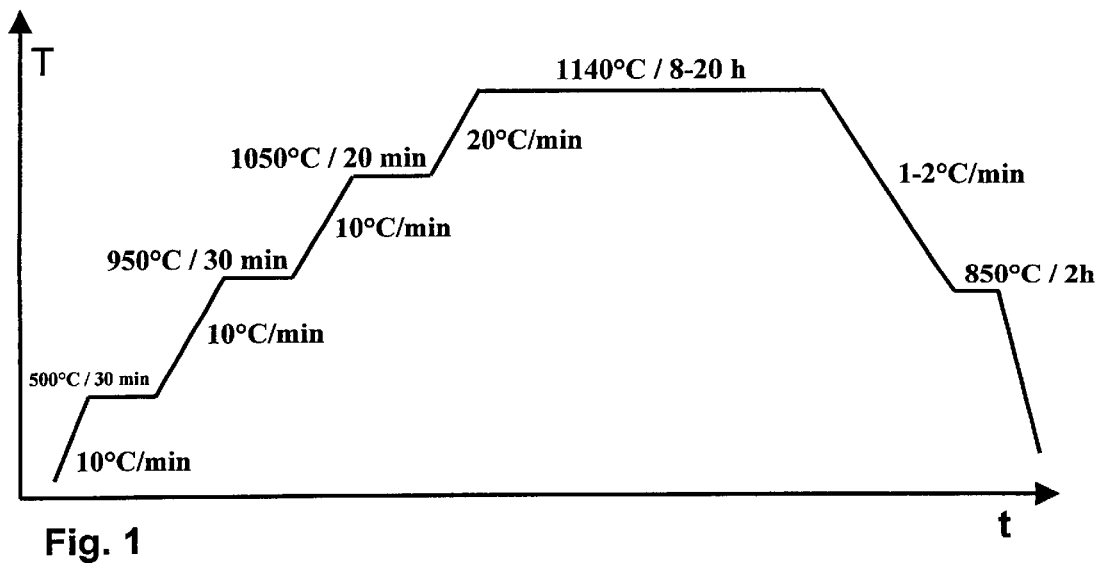
FIG. 1 shows a heat treatment cycle for SX-brazing.

A possible heat cycle for SX-brazing is shown in FIG. 1. The heating rate is selected in such a way that deformation and cracking is avoided. The heating rate from 1050° C. to the brazing temperature of 1140° C. is chosen very high (10–20° C./min) to guarantee good wetting and filling behavior of the braze alloy into the crack. The melting range of $\Delta T_0$ of the used braze alloy shall be bypassed very quickly in order to ensure a complete melting and a homogenous distribution of the alloying elements within the molten braze. The superheating itself i.e. the difference between the brazing temperature and the $T_{liquidus}$ of the braze alloy, does not affect the wetting behavior. Brazing itself takes place at 1120–1160° C. When isothermal solidification is accomplished all the boron is located in the form of small borides in the base material near the braze joint. The chemical composition of the braze alloy after the brazing cycle will essentially be the nominal composition of the braze-alloy no. 1 to no. 8 without any boron. Diffusion and back-diffusion, i.e. diffusion from elements of the parent metal into the brazed joint of all other elements (Cr, Co, W, Ta, Al) are very slow compared to that of boron.

Figure 3:
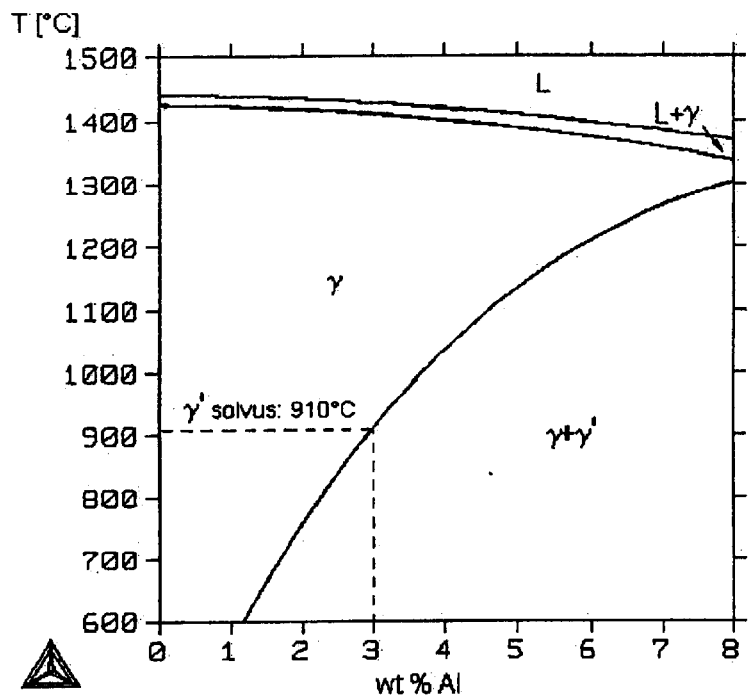
FIG. 3 shows a phase diagram of a braze alloy

At the end of the heat treatment, the temperature is slowly lowered at a cooling rate of 1–2° C./min from the brazing temperature of 1140° C. to 850° C. and held there for 1–6 hours. This heat treatment acts as an in-situ gamma prime precipitation heat treatment for the brazed joint. As indicated in FIG. 3, which shows a phase diagram for the mentioned braze alloy without any boron. The γ'-solvus temperature is very low due to the low Al-content. During cooling from 1140° C. to 850° C. the γ'-phase precipitates in the brazed joint and forms a homogenous γ/γ'-microstructure with a γ'-particle size of 0.2–0.4 μm.

The brazing heat treatment must not effect the microstructure or the mechanical properties of the parent material. Long holding times at elevated temperatures (above 1140° C.) lead to coarsening of the γ'-particles in the parent metal.

Figure 2:
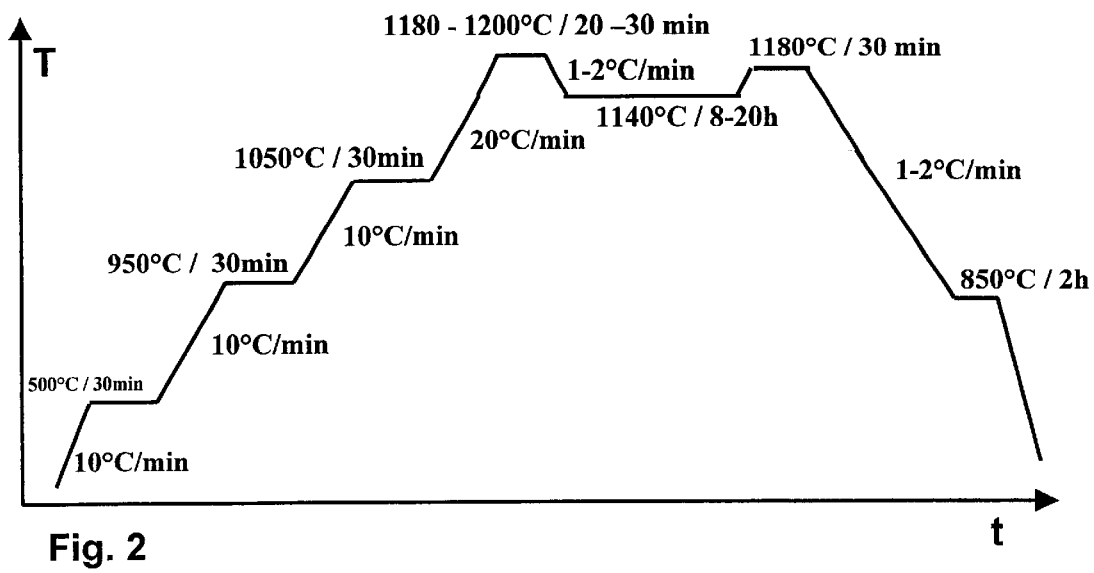
FIG. 2 shows a modified heat treatment cycle for SX-brazing.

As seen from FIG. 2, which shows a modified brazing cycle, there can be before the heat treatment of 1120–1160° C. a heat treatment of 1180° C. for 30 mm to allow for a good melting of the brazing material. This will be followed by a slow cooling of 1–2° C./min. to allow for the growth of single crystal structure in the brazing seam.

After the heat treatment of 1120–1160° C. a heat treatment of 1180° C. for 30 min for in-situ adjusting of the microstructure of the brazing seam before the precipitation of the γ'-phase.

Experimental Results, Influence of Elements

As a result the isothermal solidification of brazing was optimized when it is conducted under the following conditions. The temperature of the isothermal solidification has to be chosen between (1) $T_{Liqidus,\ Braze}+5*(\text{wt-}\%B_{Braze})$ and $(T_{solidus,\ base\ material}-70*(\text{wt-}\%B_{Braze}))$, while (2) $(\text{wt-}\%B_{Braze}*\text{wt-}\%\ Cr_{Braze})$ is between 15 and 40 and (3) $(T_{solv.\gamma',\ base\ material}-T_{Liqidus,\ Braze})$ is above 140° C.

For the experiments of the base material a composition was used which consists of (wt-%) 6.3–6.6 Cr, 9.3–10 Co, 0.5–0.7 Mo, 6.2–6.6 W, 6.3–6.7 Ta, 2.8–3.1 Re, 5.45–5.75 Al, 0.9–1.1 Ti, 0.17–0.23 Hf, 200–260 ppm C, 50–80 ppm B, to balance Ni and unavoidable impurities.

This material has the characteristic temperatures
$T_{solidus,\ base\ material}=1340°$ C.
$T_{solv.\gamma',\ base\ material}=1250°$ C.

The table 2 shows a selection of the elements Cr and B suitable for the isothermal solidification according to the present invention.

TABLE 2

| Braze | wt.- % Cr | wt.- % B | 5*(wt- % B) | 70*(wt- % B) | Cr * B | $T_{Liquidus}$ | SX brazing |
|---|---|---|---|---|---|---|---|
| No. 1 | 10 | 2.5 | 12.5 | 175 | 25 | 1106° C. | yes |
| No. 2 | 14 | 2.7 | 12.1 | 189 | 37.8 | 1104° C. | yes |
| No. 3 | 15 | 2.3 | 11.5 | 161 | 34.5 | 1110° C. | yes |
| No. 4 | 15 | 2.0 | 10 | 140 | 30 | 1109° C. | yes |
| No. 5 | 15 | 1.6 | 8 | 112 | 24 | 1110° C. | yes |
| No. 6 | 15 | 2.0 | 10 | 140 | 30 | 1109° C. | yes |
| No. 7 | 15 | 1.6 | 8 | 112 | 24 | 1110° C. | yes |
| No. 8 | 10 | 1.8 | 9 | 126 | 18 | 1110° C. | yes |

All eight braze alloys mentioned in table 1 and 2 meet the compositional requirements for Single Crystal brazing. The Chromium and Boron content mainly determine the eutectic-melting behavior between 1100 and 1110° C. If the boron content is below 1.6%, a complete melting and satisfying wetting behavior at a brazing temperature of 1140° C. can not be guaranteed. On the other hand, if the content of boron is too high, there has to be too much boron which has to diffuse into the base material. Thus, according to table 3 given above, $$(\text{wt-}\%B_{Braze} * \text{wt-}\% Cr_{Braze}) \text{ is in the range between 15 and 40} \quad (1)$$

to fulfill requirements of the isothermal solidification resulting in a SX brazed joint with a homogeneous γ/γ'-microstructure. In general, the amount of Cr will be between (wt-%) 8–15 Cr and the amount of B between (wt-%) 1–3.

Boron and Chromium have a strong influence on lowering the melting point of braze alloys. Boron in addition with Chromium depresses the melting point significantly under 1200° C.

In general, elements such as Boron, Silicon, Hafnium, Zirconium can be used as Melting Point Depressant (MPD), but Boron is the favorable candidate to be used as the MPD, very little Boron (approx. 2.5 wt.-% boron) is needed to depress the melting point of superalloys significantly. Just using Silicon a minimum of 4.5 wt.-% is needed. In addition, Silicon is a slow diffusing element. As the time controlling step (holding time at the SX brazing temperature) during the brazing process is solid diffusion of Boron into the base material, a fast diffusing MPD is required. There only the use of brazing material which at least contains B and up to 3 wt.-% Si is intended. Using Hafnium or Zirconium as MPD's large amounts of Hf and Zr are needed (up to 15–20 wt.-%) because of the very slow diffusing behavior of these elements.

Chromium in the braze alloy results (together with Aluminum) in a good oxidation resistance of the braze-repaired area. Chromium as a strong solid solution hardening element increases the strength of the braze alloy. Table 3 shows the selected temperature range of the braze alloys.

The selected brazing temperature must be high enough to guarantee complete melting of the braze alloy and a high diffusion rate of boron, which acts as a melting point depressant into the base material. At the same time, the heat treatment temperature will have to be maintained low enough to avoid coarsening of the parent metal which can lead to property deterioration. For determining the isothermal temperature of the range according to the present invention, the temperature has to be above $$T_{Liqidus, Braze} + 5*(\text{wt-}\%B_{Braze}) \quad (2)$$

and below $$T_{solidus, base material} - 70*(\text{wt-}\%B_{Braze}) \quad (3)$$

The brazing temperature must be under a certain value to avoid coarsening and rafting of the γ' in the base material.

A too high brazing temperature results in a strong widening of the original crack width due to the diffusion of boron into the base material. As boron diffuses into the parent metal, the melting point of the parent metal is lowered. Boron acts as a melting point depressant (MDP). The more boron there is in the braze alloy there more boron will diffuse into the parent metal. This leads to incipient melting of the base material in the vicinity of the crack with additional eutectic solidification in those areas. This leads to detrimental mechanical properties.

Tab. 5 shows the temperatures $T_{Liquidus}$ of the braze alloy compared with the temperature $T_{solv.\gamma', base material}$ of the base material.

TAB 5

| Braze | $T_{Liquidus}$ [° C.] | $T_{solv.\gamma',base material}$ [° C.] | $T_{solv.\gamma',base material}$ − $T_{Liquidus}$ [° C.] |
|---|---|---|---|
| No.1 | 1106° C. | 1250 | 144 |
| No.2 | 1104° C. | 1250 | 146 |
| No.3 | 1110° C. | 1250 | 140 |
| No.4 | 1109° C. | 1250 | 141 |
| No.5 | 1110° C. | 1250 | 140 |
| No.6 | 1109° C. | 1250 | 141 |
| No.7 | 1110° C. | 1250 | 140 |
| No.8 | 1110° C. | 1250 | 140 |

For a good isothermal solidification process, the temperature gap between $T_{solv.\gamma', base material}$ and $T_{Liquidus}$ has to be $$T_{solv.\gamma', base material} - T_{Liquidus} > 140° C. \quad (4)$$

The melting point of the braze alloy should be as low as possible, i.e. as low as possible under $T_{solv.\gamma', base material}$. This allows the brazing heat treatment to be long enough at the brazing temperature to avoid any harm to the base material and the according mechanical properties.

The stability of the γ/γ'-microstructure is strongly dependent on the Aluminum and Tantalum content. Ta stabilizes

TABLE 3

| Braze | 5*(wt-% $B_{Braze}$) | 70*(wt-% $B_{Braze}$) | $T_{Liquidus}$ [° C.] | $T_{Liquidus}$ + 5*(wt-% $B_{Braze}$) [° C.] | $T_{solidus, base material}$ [° C.] | $T_{solidus, base material}$ −70*(wt-% $B_{Braze}$) [° C.] |
|---|---|---|---|---|---|---|
| No. 1 | 12.5 | 175 | 1106° C. | 1118.5 | 1340 | 1165 |
| No. 2 | 12.1 | 189 | 1104° C. | 1116.1 | 1340 | 1151 |
| No. 3 | 11.5 | 161 | 1110° C. | 1121.5 | 1340 | 1179 |
| No. 4 | 10 | 140 | 1109° C. | 1119 | 1340 | 1200 |
| No. 5 | 8 | 112 | 1110° C. | 1118 | 1340 | 1228 |
| No. 6 | 10 | 140 | 1109° C. | 1119 | 1340 | 1200 |
| No. 7 | 8 | 112 | 1110° C. | 1118 | 1340 | 1228 |
| No. 8 | 9 | 126 | 1110° C. | 1119 | 1340 | 1214 | the gamma prime, an increasing Ta content shifts the gamma prime solvus line to higher temperatures. It is possible to design the microstructure of the brazed joint after the brazing cycle, which means without any MPD—Boron by considering the sum of the Al and Ta content. All eight braze alloys mentioned in Tab. 1 show a homogeneous γ/γ'-microstructure after the brazing heat treatment.

Figure 4:
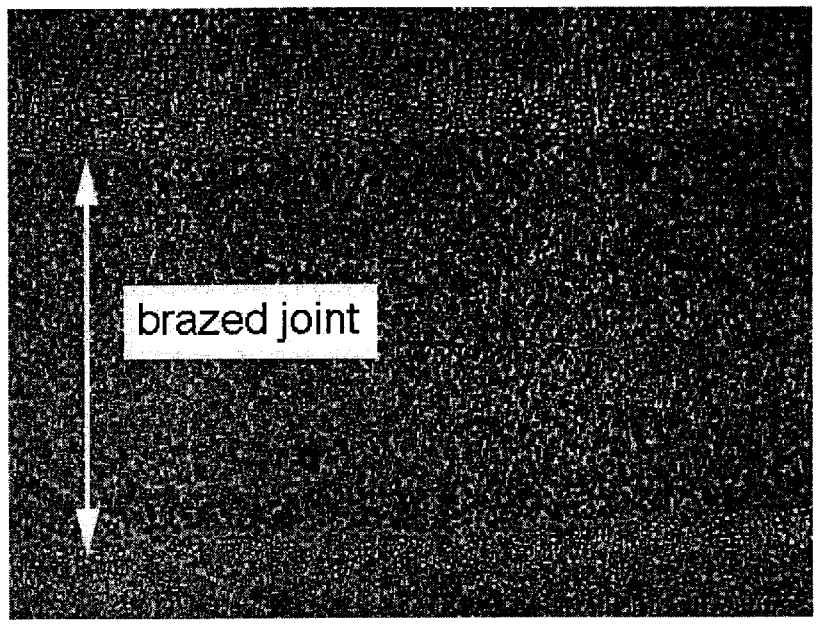
FIG. 4 shows a joint, which is brazed according to the invention.
Figure 5:
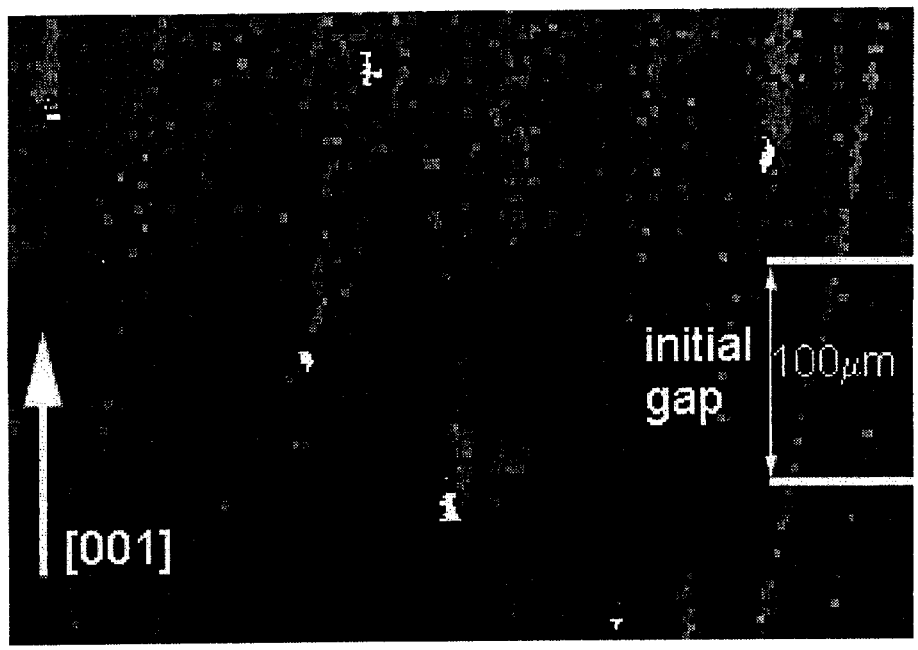
FIG. 5 shows a EBSD Kikuchi map of a single crystal brazed joint.
Figure 6:
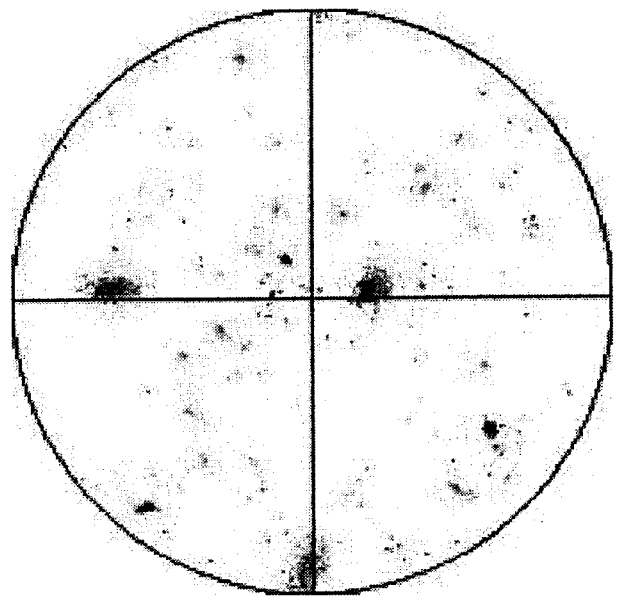
FIG. 6 shows the pole figure of the EBSD Kikuchi of FIG. 5.

A tensile test with a 100 μm wide brazed joint in the middle of the gauge length performed at room temperature reached $R_m$=712 MPa. This is 72% of the parent metal (CMSX4) properties, $R_m$=986 MPa. The sample failed at the brazed joint. The tensile test results however showed that the brazed joint is capable of bearing high loads. As an example in FIG. 4 is shown a joint which is brazed according to the invention. It has a gap of 120 μm width. During holding at the brazing temperature the melt in the gap has solidified isothermally. To reach isothermal solidification with a γ/γ'-microstructure within reasonable time the gap should not be wider than 300 μm. FIG. 5 shows a Electron Back Scattering Diffraction (EBSD) Kikuchi map for the single crystal brazed joint. The blue color indexes the [001] direction. FIG. 6 shows the 001 pole figure of FIG. 5. The dark blue color and all the shades of the blue are indicating the [001]-direction, deviation less than 1°.

What is claimed is:

1. A method of joining or repairing cracks or gaps in a single crystal article made of a Nickel based superalloy with a brazing alloy comprising at least γ'-phase forming elements and at least boron as melting point depressant, comprising:

isothermal, epitaxial single crystal solidification of the brazing alloy, wherein the Temperature of the isothermal solidification is between $T_{Liqidus, Braze} +5*(wt-\%B_{Braze})$ and $(T_{solidus, base\ material} -70*(wt-\%B_{Braze}))$, while $(wt-\%B_{Braze}*wt-\%Cr_{Braze})$ is between 15 and 40 and $(T_{solv.\gamma', base\ material} - T_{Liqidus, Braze})$ is above 140° C.

2. The method according to claim 1, wherein the base material consists of (wt-%) 6.3–6.6 Cr, 9.3–10 Co, 0.5–0.7 Mo, 6.2–6.6 W, 6.3–6.7 Ta, 2.8–3.1 Re, 5.45–5.75 Al, 0.9–1.1 Ti, 0.17–0.23 Hf, 200–260 ppm C, 50–80 ppm B, balance Ni and unavoidable impurities.

3. The method according to claim 1, wherein the braze material is Ni based and contains (wt-%) 8–15 Cr and (wt-%) 1–3 B.

4. The method according to claim 1, wherein the isothermal solidification comprises heat treatment at a temperature of 1120° C.–1160° C. for 8 to 20 h.

5. The method according to claim 4, wherein the heat treatment of the isothermal solidification takes place at a temperature of 1140° C.

6. The method according to claim 4, wherein after the heat treatment there is a heat treatment of 1180° C. for 30 mm.

7. The method according to claim 4, wherein before the heat treatment there is a heat treatment of 1180° C. to 1200° C. for 20 to 30 mm followed by a cooling of 1° C.–2° C./min.

8. The method according to claim 4, wherein after the heat treatment the temperature is lowered at a rate of 1° C.–2° C./min to a temperature between 800° C.–900° C. and the temperature is held for 1 to 6 hours.

9. The method according to claim 1, further comprising brazing the crack or gap with a maximum width of 300 μm.

10. The method according to claim 1, further comprising:

applying a braze slurry into and over the crack or gaps and applying a mixture of brazing alloy and filler material on top of the braze slurry, before the heat treatment of the brazing.

11. The method according to claim 1, further comprising:

removing a protective coating before the isothermal solidification: and applying a protective coating after the isothermal solidification.

12. The method according to claim 1, further comprising cleaning the surface of the crack or gap from oxides before the isothermal solidification.

13. The method according to claim 1, further comprising:

Flour-Ion-Cleaning the surface before the isothermal solidification.

14. The method according to claim 5, wherein after the heat treatment there is a heat treatment of 1180° C. for 30 mm.

15. The method according to claim 5, wherein before the heat treatment there is a heat treatment of 1180° C. to 1200° C. for 20 to 30 mm followed by a cooling of 1° C.–2° C./min.

* * * * *